United States Patent
Bickford et al.

(10) Patent No.: US 8,539,429 B1
(45) Date of Patent: Sep. 17, 2013

(54) SYSTEM YIELD OPTIMIZATION USING THE RESULTS OF INTEGRATED CIRCUIT CHIP PERFORMANCE PATH TESTING

(75) Inventors: Jeanne P. Bickford, Essex Junction, VT (US); Peter A. Habitz, Hinesburg, VT (US); Vikram Iyengar, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/572,954

(22) Filed: Aug. 13, 2012

(51) Int. Cl.
*G06F 17/50* (2006.01)

(52) U.S. Cl.
USPC .............................. 716/136; 716/56; 716/134

(58) Field of Classification Search
USPC ........................................... 716/56, 134, 136
See application file for complete search history.

(56) References Cited

U.S. PATENT DOCUMENTS

| | | | |
|---|---|---|---|
| 5,761,481 A | 6/1998 | Kadoch et al. | |
| 6,901,564 B2 * | 5/2005 | Stine et al. | 716/56 |
| 7,174,523 B2 * | 2/2007 | Engel et al. | 716/52 |
| 7,469,394 B1 | 12/2008 | Hutton et al. | |
| 7,487,477 B2 * | 2/2009 | Bickford et al. | 716/136 |
| 7,525,373 B1 | 4/2009 | Ogilvie et al. | |
| 7,539,893 B1 * | 5/2009 | Ferguson | 714/6.1 |
| 7,656,182 B2 * | 2/2010 | Bickford et al. | 324/762.06 |
| 7,895,545 B2 * | 2/2011 | Cohn et al. | 716/129 |
| 7,917,451 B2 * | 3/2011 | Barnett et al. | 705/400 |
| 8,127,157 B2 | 2/2012 | Bilak | |
| 8,129,262 B1 | 3/2012 | Bulucea et al. | |
| 2004/0025123 A1 | 2/2004 | Angilivelil | |
| 2009/0182522 A1 * | 7/2009 | Visweswariah et al. | 702/117 |
| 2009/0234777 A1 * | 9/2009 | Barnett et al. | 705/400 |
| 2011/0191055 A1 * | 8/2011 | Martinez et al. | 702/117 |
| 2012/0010837 A1 * | 1/2012 | Habitz et al. | 702/79 |
| 2013/0014075 A1 * | 1/2013 | Habitz et al. | 716/136 |

OTHER PUBLICATIONS

Xiong, et al., "Optimal Margin Computation for At-Speed Test," Proceeding of the conference on Design, Automation and Test in Europe, 2008, 6 pages.

Xiong, et al., "Pre-ATPG Path Selection for Near Optimal Post-ATPG Process Space Coverage," IEEE/ACM International Conference on Computer-Aided Design Digest of Technical Papers, 2009, pp. 89-96.

Lee, et al., "Critical Path Identification and Delay Tests of Dynamic Circuits," IEEE, ITC International Test Conference, Paper 16.3, 1999, pp. 421-430.

(Continued)

*Primary Examiner* — Naum Levin
(74) *Attorney, Agent, or Firm* — Gibb & Riley, LLC; Richard M. Kotulak, Esq.

(57) ABSTRACT

Disclosed are embodiments of a method, system and computer program for optimizing system yield based on the results of post-manufacture integrated circuit (IC) chip performance path testing. In these embodiments, a correlation is made between IC chip performance measurements, which were acquired from IC chips specifically during post-manufacture (i.e., wafer-level or module-level) performance path testing, and system performance measurements, which were acquired from systems that incorporate those IC chips previously subjected to performance path testing. Based on this correlation and a target system performance value, a post-manufacture (i.e., wafer-level or module-level) chip dispositioning rule can be adjusted to optimize system yield (i.e., to ensure that subsequently manufactured systems which incorporate the IC chip meet the target system performance value). Optionally, simulation of such processing can be performed during design of the IC chip for incorporation into the system in order establish the initial chip dispositioning rule in the first place.

20 Claims, 5 Drawing Sheets

(56) References Cited

OTHER PUBLICATIONS

Xiong, et al., "Statistical Multilayer Process Space Coverage for At-Speed Test," IEEE/ACM Design Automation Conference, 22.1, Jul. 26-31, 2009, pp. 340-345.

Zolotov, et al., "Statistical Path Selection for At-Speed Test," ACM International Conference on Computer-Aided Design, Nov. 2008, 8 pages.

Iyengar, et al., "Variation-Aware Performance Verification Using At-Speed Structural Test and Statistical Timing," IEEE, AVM International Conference on Computer-Aided Design, Nov. 2007, pp. 405-412.

U.S. Appl. No. 13/294,210, filed Nov. 11, 2011.
U.S. Appl. No. 13/294,220, filed Nov. 11, 2011.
U.S. Appl. No. 13/294,243, filed Nov. 11, 2011.

Kruseman, et al., "On Performance Testing with Path Delay Patterns," 25th IEEE VLSI Test Symposium, May 6-10, 2007, pp. 29-34.

* cited by examiner

SYSTEM YIELD OPTIMIZATION USING THE RESULTS OF INTEGRATED CIRCUIT CHIP PERFORMANCE PATH TESTING

BACKGROUND

1. Field of the Invention

The embodiments disclosed herein relate to system performance and, more particularly, to a method, system and computer program product for optimizing system yield (i.e., achieving a target system performance value) based on the results of post-manufacture integrated circuit (IC) chip performance path testing.

2. Description of the Related Art

Currently, performance measurements and, particularly, frequency measurements acquired during performance screen ring oscillator (PSRO) testing are often used to disposition (i.e., screen) integrated circuit (IC) chips at both the wafer-level and the module-level (i.e., the IC chip package-level). For purposes of this disclosure, wafer-level IC chip dispositioning refers to wafer-level performance testing to determine whether IC chips on wafers pass and, thus, are processed into IC chip modules or fail and, thus, are scrapped. Similarly, module-level IC chip dispositioning refers to module-level performance testing to determine whether the IC chip modules pass and, thus, are shipped to customers for incorporation into systems or fail and, thus, are scrapped.

Additionally, a correlation can be made between performance measurements acquired from IC chips during post-manufacture (i.e., wafer-level or module level) PSRO testing and performance measurements taken from systems, which later incorporate the IC chips. This correlation can then be used to adjust a wafer-level or module-level IC chip dispositioning rule in an attempt to improve system yield (i.e., to increase the likelihood that subsequently manufactured systems incorporating the IC chips will meet system performance specifications). Unfortunately, the correlation between post-manufacture PSRO performance measurements and system performance measurements is typically not a very strong correlation and, thus, adjustments to the IC chip dispositioning rule based on this correlation may not improve system yield as predicted.

SUMMARY

In view of the foregoing, disclosed herein are embodiments of a method, system and computer program for optimizing system yield based on the results of post-manufacture integrated circuit (IC) chip performance path testing. In these the embodiments, a correlation can be made between IC chip performance measurements, which were acquired from IC chips specifically during post-manufacture (i.e., wafer-level or module-level) performance path testing, and system performance measurements, which were acquired from systems incorporating IC chips previously subjected to performance path testing. Based on this correlation and a target system performance value, a post-manufacture (i.e., wafer-level or module-level) IC chip dispositioning rule can be adjusted in order to optimize system yield (i.e., to ensure that subsequently manufactured systems which incorporate the IC chip meet the target system performance value). Optionally, simulation of such processing can be performed during design of the IC chip for incorporation into the system in order establish the initial IC chip dispositioning rule in the first place.

More particularly, disclosed herein are embodiments of a computer-implemented method for optimizing system yield based on the results of post-manufacture integrated circuit (IC) chip performance path testing. The method can comprise accessing (e.g., by a computer from a memory) information regarding an IC chip and a system that is designed to incorporate that IC chip. This information can comprise at least a target system performance value, IC chip performance measurements acquired during post-manufacture (e.g., wafer-level or module-level) performance path testing of a group of integrated circuit chips, and system performance measurements acquired during performance testing of a group of systems, where each system in the group of systems incorporates at least one of the IC chips from the group of IC chips which were previously subjected to performance path testing.

The method can further comprise determining (e.g., by the computer) a correlation between the IC chip performance measurements and the system performance measurements. This correlation and the target system performance value can then be used (e.g., by the computer), if necessary, to adjust an IC chip dispositioning rule (e.g., a wafer-level or module-level IC chip dispositioning rule) in order to optimize system yield (i.e., to ensure that subsequently manufactured systems which incorporate the IC chip meet the target system performance value).

Optionally, simulation of such processing can be performed during design of the IC chip for incorporation into the system in order establish the initial IC chip dispositioning rule in the first place. Specifically, as the IC chip is being designed, an IC chip process window suitable for achieving a target system process window can be determined. Then, the initial IC chip dispositioning rule can be established by running performance path test timing based on this IC chip process window.

Also disclosed herein are embodiments of a computer system for optimizing system yield based on the results of post-manufacture integrated circuit (IC) chip performance path testing. This computer system can comprise a memory that receives and stores information regarding an IC chip and a system that is designed to incorporate that IC chip. This information can include, but is not limited to, a target system performance value, IC chip performance measurements acquired during post-manufacture (e.g., wafer-level or module-level) performance path testing of a group of integrated circuit chips, and system performance measurements acquired during performance testing of a group of systems, where each system in the group of systems incorporates at least one of the IC chips from the group of IC chips that were previously subjected to performance path testing.

This computer system can further comprise at least one processor in communication with the memory (i.e., able to access the information stored in the memory). The processor(s) can comprise a correlator and a dispositioning rule adjuster. The correlator can determine a correlation between the IC chip performance measurements and the system performance measurements. The dispositioning rule adjuster can be in communication with the correlator and, if necessary, can adjust an IC chip dispositioning rule (e.g., a wafer-level or module-level IC chip dispositioning rule) based on the correlation and the target system performance value in order to optimize system yield (i.e., to ensure that subsequently manufactured systems which incorporate the IC chip meet the target system performance value).

Optionally, the processor(s) can further comprise a design tool that can simulate such processing during design of the IC chip for incorporation into the system in order establish the initial IC chip dispositioning rule. Specifically, as the IC chip is being designed, the design tool can determine an IC chip process window suitable for achieving a target system process window. Then, the design tool can establish the initial IC chip dispositioning rule by running performance path test timing based on this IC chip process window.

Also disclosed herein are embodiments of a computer program product. This computer program product can comprise a computer-readable storage medium that stores computer-readable program code and the computer-readable program code can comprise instructions that, when executed by a computer, perform the above-described method for optimizing system yield based on the results of post-manufacture integrated circuit (IC) chip performance path testing.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
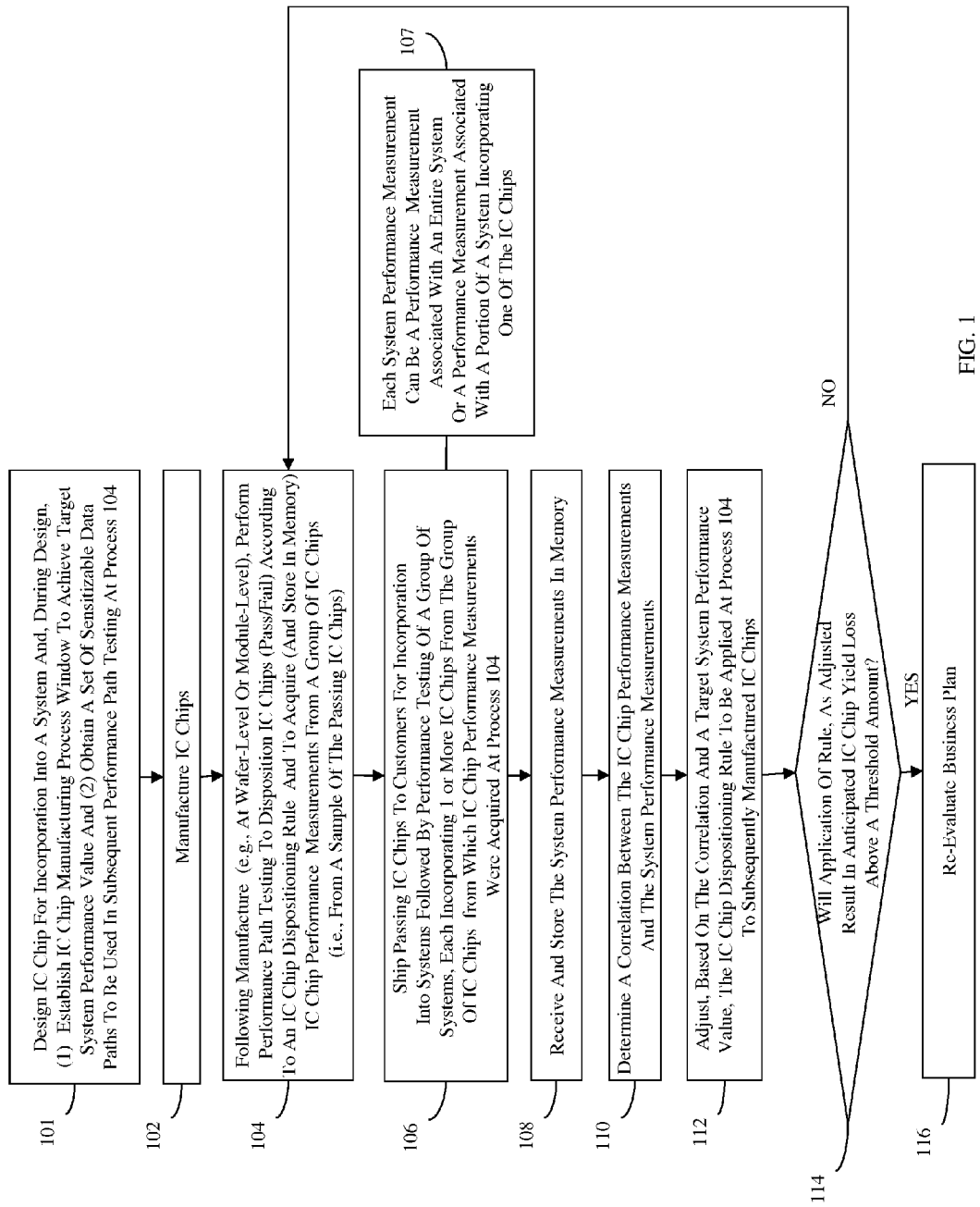
FIG. 1 is a flow diagram illustrating an embodiment of a method for optimizing system yield based on the results of post-manufacture integrated circuit (IC) chip performance path testing.

As mentioned above, performance measurements and, particularly, frequency measurements acquired during performance screen ring oscillator (PSRO) testing are often used to disposition (i.e., screen) integrated circuit (IC) chips at both the wafer-level and the module-level (i.e., the IC chip package-level). For purposes of this disclosure, wafer-level IC chip dispositioning refers to wafer-level performance testing to determine whether IC chips on wafers pass and, thus, are processed into IC chip modules or fail and, thus, are scrapped. Similarly, module-level IC chip dispositioning refers to module-level performance testing to determine whether the IC chip modules pass and, thus, are shipped to customers for incorporation into systems or fail and, thus, are scrapped.

Additionally, a correlation can be made between performance measurements acquired from IC chips during post-manufacture (i.e., wafer-level or module level) PSRO testing and performance measurements taken from systems, which later incorporate the IC chips. This correlation can then be used to adjust a wafer-level or module-level IC chip dispositioning rule in an attempt to improve system yield (i.e., to increase the likelihood that subsequently manufactured systems incorporating the IC chips will meet system performance specifications). Unfortunately, the correlation between post-manufacture PSRO performance measurements and system performance measurements is typically not a very strong correlation and, thus, adjustments to the IC chip dispositioning rule based on this correlation may not improve system yield as predicted.

In view of the foregoing, disclosed herein are embodiments of a method, system and computer program for optimizing system yield based on the results of post-manufacture integrated circuit (IC) chip performance path testing. In these the embodiments, a correlation can be made between IC chip performance measurements, which were acquired from IC chips specifically during post-manufacture (i.e., wafer-level or module-level) performance path testing, and system performance measurements, which were acquired from systems incorporating IC chips previously subjected to performance path testing. Based on this correlation and a target system performance value, a post-manufacture (i.e., wafer-level or module-level) IC chip dispositioning rule can be adjusted in order to optimize system yield (i.e., to ensure that subsequently manufactured systems which incorporate the IC chip meet the target system performance value). Optionally, simulation of such processing can be performed during design of the IC chip for incorporation into the system in order establish the initial IC chip dispositioning rule in the first place.

More particularly, disclosed herein are embodiments of a computer-implemented method for optimizing system yield based on the results of post-manufacture integrated circuit (IC) chip performance path testing.

The method can comprise performing an integrated circuit (IC) chip design process to design an IC chip that is to be incorporated into a system (101). Those skilled in the art will recognize that such a design process typically begins with receipt (e.g., from a customer) of a high-level description of the IC chip, which sets out the requirements for the IC chip using a hardware description language (HDL). This high-level description can then be synthesized into a low-level description of the IC chip (e.g., a gate-level netlist). Then, placement of devices (or cells) on the IC chip can be established based on the low-level description. Following placement, a timing analysis can be performed. It should be noted that prior to performing the timing analysis, a manufacturing process window for the IC chip (e.g., a -X$\sigma$ Fmax (fast) value to a X$\sigma$ Fmax (slow) value, such as a -3$\sigma$ Fmax (fast) value to a 3$\sigma$ Fmax (slow) value), which is suitable for achieving a target system performance value (e.g., a system Fmax value in any system manufactured that is faster than a specified system Fmax value), can be specified (i.e., determined). Then, during the timing analysis, a timing run can be made based on the specified IC chip manufacturing process window and using statistical modeling. Based on the results of the timing run, a set of sensitizable data paths within the IC chip can be obtained (i.e., selected) for subsequent post-manufacture performance path testing and an expected delay or, more particularly, a minimum allowable delay, under specified test conditions (e.g., under a specified voltage, a specified temperature, and a specified slowest performance value expected from the manufacturing line, such as the specified 3$\sigma$ Fmax (slow) value) can be calculated for each of the sensitizable data paths. For a more detailed discussion regarding how the set of sensitizable data paths can be obtained see the following U.S. patent applications assigned to International Business Machines Corporation of Armonk, N.Y., and incorporated herein by reference: application Ser. No. 13/294,210, titled "Test Path Selection And Test Program Generation For Performance Testing Integrated Circuit Chips" of Bickford et al., filed on Nov. 11, 2011 and U.S. patent application Ser. No. 13/294,220, titled "Disposition Of Integrated Circuits Using Performance Sort Ring Oscillator And Performance Path Testing" of Bickford et al., filed on Nov. 11, 2011). Following the timing analysis, detailed routing can be performed.

The above-described design steps can be iteratively repeated in order to optimize performance, costs, etc. The results of the design process can then be compiled into a design structure. The design structure may be generated and stored in memory such that it employs a data format used for the exchange of layout data of integrated circuits and/or symbolic data format (e.g. information stored in a GDSII (GDS2), GL1, OASIS, map files, or any other suitable format for storing such design data structures). The design structure may also be generated and stored in memory such that it comprises information such as, for example, symbolic data, map files, test data files, design content files, manufacturing data, layout parameters, wires, levels of metal, vias, shapes, data for routing through the manufacturing line, and any other information, data or instructions required by a manufacturer or other designer/developer to produce the integrated circuit chip, such as the specified IC chip manufacturing process window required to achieve the target system performance value and a list identifying the set of sensitizable data paths selected for post-manufacture performance path testing. This design structure may subsequently be released to manufacturing.

Next, IC chips can be manufactured using the design structure output at process 101 (102).

Following manufacture, performance testing of manufactured IC chips can be performed at the wafer-level and at the module-level. However, in the embodiments disclosed herein, the performance testing performed at any one of these levels (i.e., at wafer-level or at module-level) can specifically comprise performance path testing to both disposition the IC chips according to an IC chip dispositioning rule and acquire (and store in memory) IC chip performance measurements from a sample of the passing IC chips (104).

During performance path testing at process 104, the set of sensitizable data paths within the IC chip can be tested under specified test conditions. As discussed above, this set of sensitizable data paths can be obtained (i.e., selected) during design and, particularly, during timing analysis at process 101. Specifically, during timing analysis at process 101, a timing run can be made using statistical modeling and based on the specified manufacturing process window (i.e., a specified -X$\sigma$ Fmax (fast) value to a specified X$\sigma$ Fmax (slow) value, such as a -3$\sigma$ Fmax (fast) value to a 3$\sigma$ Fmax (slow) value). Based on the results of the timing run, the set of sensitizable data paths within the IC chip can be selected for subsequent post-manufacture performance path testing and an expected delay or, more particularly, a minimum allowable delay, under specified test conditions (e.g., under a specified voltage, a specified temperature, and a specified slowest performance value expected from the manufacturing line, such as the specified 3$\sigma$ Fmax (slow) value) can be calculated for each of the sensitizable data paths. Then, at process 104, performance testing of the set of sensitizable data paths under the specified test conditions can be performed to determine the actual delay associated with each of the sensitizable data paths. Following performance testing, the IC chips can be dispositioned pass or fail (i.e., Go or No Go) based on a comparison of the actual delay of each of the selected data paths to the minimum allowed delay (which is associated with the slowest allowable Fmax value, as set forth in an IC chip dispositioning rule). For example, IC chips with any data path testing slower than the minimum allowed delay can be considered to have failed and, thus, can be scrapped. However, IC chips with all of the selected data paths testing at or faster than the minimum allowed delay can be considered to have passed. See U.S. patent application Ser. No. 13/294,210 and U.S. patent application Ser. No. 13/294,220, incorporated by reference above, for a more detailed discussion of how performance path testing for chip dispositioning purposes is performed.

Next, a group of the IC chips and, particularly, a sample of the passing IC chips following dispositioning can further undergo performance path shmoo testing at process 104 in order to acquire IC chip performance measurements. That is, following IC chip dispositioning, a group of the IC chips and, particularly, a sample of the passing IC chips can be selected and subjected to additional performance path testing and, particularly, subjected to performance path shmoo testing to acquire IC chip performance measurements. The sample of passing IC chips should be a representative sample of IC chips within the specified manufacturing IC chip process window. During performance path shmoo testing, the testing frequency of each passing IC chip can be increased until that IC chip fails. The frequencies at which the previously passing IC chips fail can then be used as the aforementioned IC chip performance measurements and stored in memory. Alternatively, IC chip delay can be deduced from the frequency at which an IC chip finally fails. Deduced delays for the IC chips can then be used as the aforementioned IC chip performance measurements and stored in memory.

The passing IC chips can then be processed, as appropriate. That is, following wafer-level performance testing and dispositioning, passing IC chips can be packaged into IC chip modules and then subjected to module-level performance testing and dispositioning. Following module-level performance testing and dispositioning, all passing IC chips (i.e., IC chips which were not scrapped following wafer-level or module-level dispositioning) can be shipped to a customer (106). The customer can incorporate the passing IC chips into systems (all having the same system design) and a group of those systems and, particularly, systems that incorporate IC chips that were previously subjected to performance path testing, can be subjected to system performance testing.

Specifically, systems can be manufactured (e.g., by a customer purchasing the passing IC chips), according to a particular system design, using, as a component in each one of the systems, at least one of the passing IC chips. Once manufactured, system performance testing can be performed (e.g., by the customer) on a group of the manufactured systems, where each system in the group of systems incorporates at least one of the IC chips from the group of IC chips (i.e., from the sample of passing IC chips) which were previously subjected to performance path testing at process 104 in order to acquire IC performance measurements.

System performance testing can specifically be performed in order to acquire system performance measurements (e.g., system Fmax measurements). Those skilled in the art will recognize that there are various system performance tests that can be performed where system performance, such as system Fmax, can be measured for a given operation. These system performance tests can be performed at the overall system level in the case of simple systems. However, for more complex systems, these system performance tests can be performed at some intermediate level within the system assembly above the IC chip level (e.g., at the printed circuit board level or at another part level). Thus, the system performance measurements (e.g., system Fmax measurements) referred to herein are associated with either the overall system or a portion of the system (e.g., a printed circuit board or higher level part within the system assembly), which incorporates at least one of the IC circuit chips (see item 107). Consequently, it should be understood that each system performance measurement accounts for, not only the performance of the IC chip, but also the performance of at least some other components within the system, if not all the other components within the system. The results of system performance testing (i.e., the system performance measurements) can then be reported back to the manufacturer and stored in memory.

The method embodiments can further comprise receiving (e.g., by the computer) and storing in memory the system performance measurements (108). Next, the IC chip performance measurements acquired and stored in memory at process 104 along with the system performance measurements received and stored in memory at process 108 can be accessed (e.g., by the computer from memory) and a correlation between those measurements can be determined (110). Specifically, this correlation can be a measure of the strength and direction of the relationship between the IC performance measurements and the system performance measurements. This correlation and the target system performance value can then be used (e.g., by the computer), if necessary, to adjust an IC chip dispositioning rule (e.g., a wafer-level or module-level IC chip dispositioning rule) in order to optimize system yield (i.e., to ensure that subsequently manufactured systems which incorporate the IC chip meet the target system performance value) (112). For example, based on the correlation, the minimum allowed delay for the IC chip, which is associated with a slowest allowable IC chip Fmax value, can be adjusted and, particularly, decreased in order to ensure that systems which incorporate the IC chips have an Fmax that is no slower than the slowest allowable system Fmax value.

It should be noted that, optionally, application of the IC chip dispositioning rule, as adjusted, following subsequent manufacture of IC chips can be conditional upon business policies. For example, the method can further comprise determining (e.g., by the computer) whether use of the IC chip dispositioning rule, as adjusted, will result in an anticipated IC chip yield loss above a threshold IC chip yield loss value (114). This threshold IC chip yield loss can be predetermined based on a cost-benefit analysis associated with the manufacturing contract (e.g., by considering the costs associated with manufacturing the IC chips, the anticipated profits, etc.). If the anticipated IC chip yield lost is not above the threshold, then the adjusted IC chip dispositioning rule can be applied at process 104 following subsequent manufacture of IC chips. However, if the use of the IC chip dispositioning rule, as adjusted, will result in an anticipated IC chip yield loss above the threshold, the business plan can be re-evaluated and any number of alternative process steps could be performed (116). For example, the contract could be cancelled, contract renegotiations could be entered into with the customer to cover the additional costs associated with yield loss, manufacturing process specifications could be adjusted in attempt to better meet the target system performance value, etc.

Figure 2:
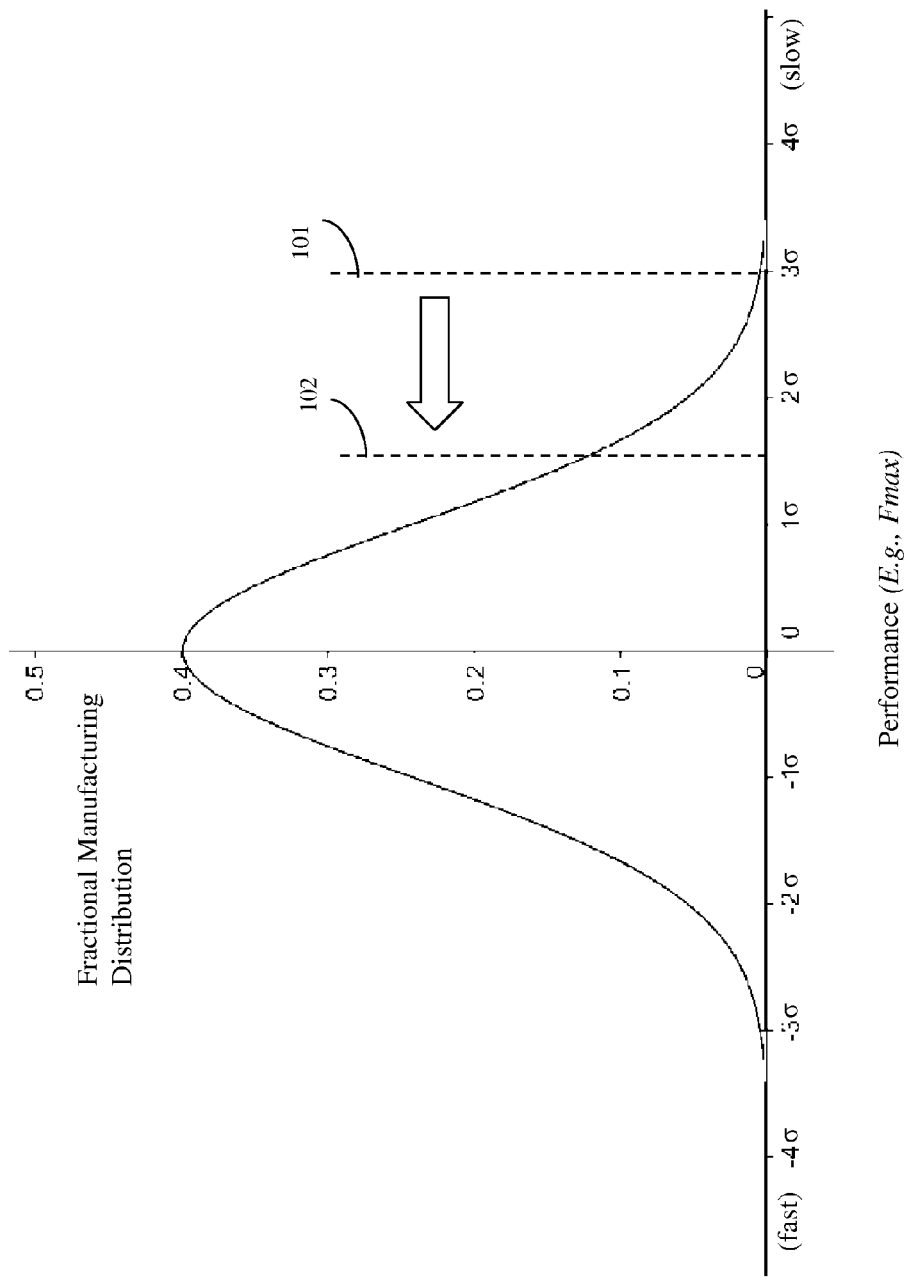
FIG. 2 a graph illustrating a Gaussian distribution associated with IC chip performance.

For example, FIG. 2 is a graph illustrating a Gaussian distribution of IC chip performance from -4σ Fmax (fast) to a 4σ Fmax (slow). Item number 101 represents a current screening value, which is defined by an IC chip dispositioning rule and which corresponds to 3σ Fmax (slow). Item number 102 represents an adjusted screening value, which is defined by an adjusted IC chip dispositioning rule. That is, based on the correlation determined at process 110, the slowest allowable IC chip Fmax value is adjusted and, particularly, decreased at process 112 to the adjusted screening value represented by item 102 in order to ensure that systems which incorporate the IC chips have an Fmax that is no slower than the slowest allowable system Fmax value. As indicated, this adjusted screening value 102 corresponds to 1.5σ Fmax (slow). In this case, if the threshold IC chip yield loss value corresponds to 1.0σ Fmax (slow), then the adjusted IC chip dispositioning rule can be applied at process 104 following subsequent manufacture of IC chips. However, if the threshold IC chip yield loss value corresponds to the 2.0σ Fmax (slow), then the business plan can be re-evaluated as discussed above.

Figure 3:
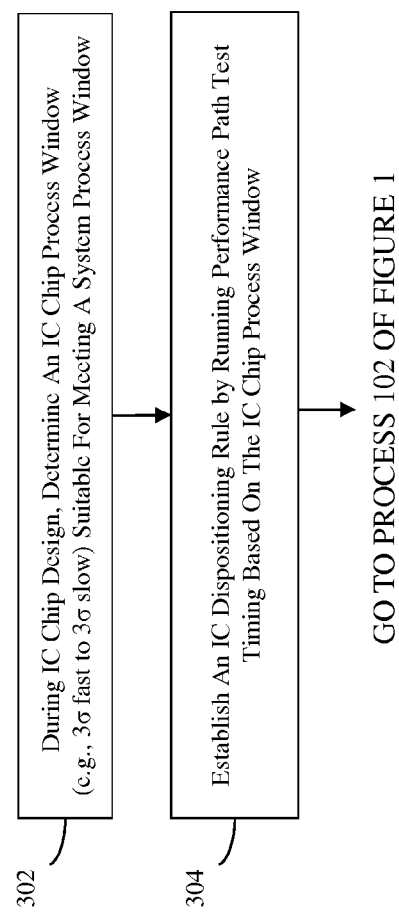
FIG. 3 is a flow diagram illustrating optional additional process steps that can be performed in conjunction with the method of FIG. 1.

As discussed in detail above, the correlation used to adjust the IC chip dispositioning rule can be established based on empirical data and, particularly, based on both IC chip performance measurements and system performance measurements. However, it should be understood that with the advancement of simulation software, performance at both the IC chip- level and system-level can be simulated during IC chip and system design in order to establish the IC chip dispositioning rule in the first place. That is, referring to FIG. 3, optionally, as the IC chip and system, which will incorporate the IC chip, are being designed, an IC chip process window suitable for achieving a target system process window can be determined (302). Then, the initial IC chip dispositioning rule and, particularly, the screening value to be applied at process 104 of FIG. 1 can be established by running performance path test timing based on this IC chip process window (304). For example, as performance path test timing runs are being performed, the IC chip Fmax (slow) value (e.g., 3.0σ Fmax (slow)) can be defined based on the system process window and, particularly, the system Fmax (slow) value. Then, following design, processing can continue at process 102 of FIG. 1 and the IC screening value can then be validated or, if necessary, adjusted at processes 108-112 of FIG. 1, as described above.

Figure 4:
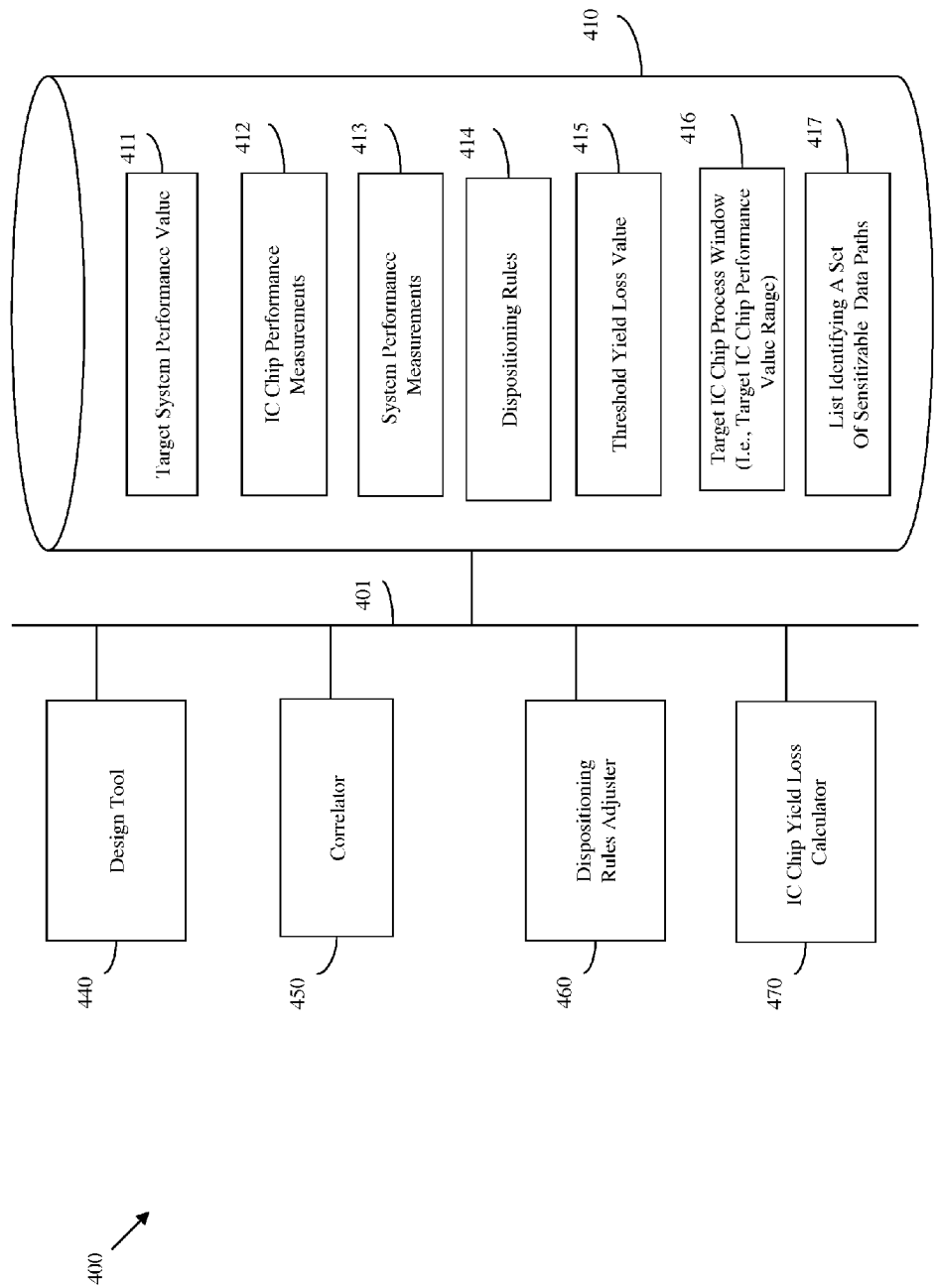
FIG. 4 is a schematic drawing illustrating an embodiment of a system for optimizing system yield based on the results of post-manufacture integrated circuit (IC) chip performance path testing.

Referring to FIG. 4, also disclosed herein are embodiments of a computer system 400 for optimizing system yield based on the results of post-manufacture integrated circuit (IC) chip performance path testing. This computer system 400 can comprise a memory 410 and at least one processor in communication with the memory 410 (e.g., over a system bus 401). The memory 410 can receive and store (i.e., can be adapted to receive and store, can be configured to receive and store, can be programmed to receive and store, etc.) information regarding a integrated circuit (IC) chip and a system that is designed to incorporate the IC chip. The processor(s) can comprise a design tool 440, a correlator 450, an IC chip dispositioning rule adjuster 460, and, optionally, an IC chip yield loss calculator 470.

The design tool 440 (e.g., a computer-aided design (CAD) tool) can be used to perform an integrated circuit (IC) chip design process to design an IC chip that is to be incorporated into a system. As discussed in detail above with regard to the method embodiments, the output of the design process is a design structure, which is stored on a computer-readable medium (e.g., a computer-readable storage medium), which is released to manufacturing and, which comprises information such as, for example, symbolic data, map files, test data files, design content files, manufacturing data, layout parameters, wires, levels of metal, vias, shapes, data for routing through the manufacturing line, and any other information, data or instructions required by a manufacturer or other designer/developer to produce the integrated circuit chip, such as a specified IC chip manufacturing process window 416 (e.g., a specified -Xσ maximum operating frequency (Fmax) (fast) value to a specified Xσ Fmax (slow) value, such as -3σ Fmax (fast) to 3σ Fmax (slow)) for the IC chip so that a target system performance value 411 can be achieved (e.g., so that the system Fmax value of any system manufactured will be faster than a specified system Fmax value) and a list 417 identifying a set of sensitizable data paths that can be tested during subsequent post-manufacturing performance path testing of the IC chip and further indicating the expected delay for such sensitizable data paths under specified test conditions.

IC chips can be manufactured using the design structure output by the design tool 440. Then, following manufacture, performance testing of manufactured IC chips can be performed at the wafer-level and at the module-level. However, in the embodiments disclosed herein, the performance testing performed at any one of these levels (i.e., at wafer-level or at module-level) can specifically comprise performance path testing (of the set of sensitizable data paths identified on the list 417) to both disposition the IC chips according to an IC chip dispositioning rule and acquire (and store in memory 410) IC chip performance measurements 412 from a sample of the passing IC chips, as discussed in detail above with regard to process 104 of FIG. 1. The passing IC chips can then be processed, as appropriate. That is, following wafer-level performance testing and dispositioning, passing IC chips can be packaged into IC chip modules and then subjected to module-level performance testing and dispositioning. Following module-level performance testing and dispositioning, all passing IC chips (i.e., IC chips which were not scrapped following wafer-level or module-level dispositioning) can be shipped to a customer. The customer can incorporate the passing IC chips into systems and a group of those systems and, particularly, systems that incorporate IC chips previously subjected to performance path testing, can be subjected to system performance testing in order to acquire (and store in memory 411) system performance measurements 413, as described in detail above with regard process 106 of FIG. 1.

The correlator 450 can access and determine (i.e., can be adapted to access and determine, can be configured to access and determine, can be programmed to access and determine, etc.) a correlation between the IC chip performance measurements 412 and the system performance measurements 413. Specifically, this correlation can be a measure of the strength and direction of the relationship between the IC performance measurements 412 of IC chips and the system performance measurements 413 of systems that incorporate the IC chips.

The IC chip dispositioning rules adjuster 460 can adjust (i.e., can be adapted to adjust, can be configured to adjust, can be programmed to adjust, etc.) an IC chip dispositioning rule 414 (e.g., a wafer-level or module-level IC chip dispositioning rule), if necessary, based on the correlation and the target system performance value 411 in order to optimize system yield (i.e., to ensure that subsequently manufactured systems which incorporate the IC chip meet the target system performance value). For example, based on the correlation output from the correlator 450, the IC chip dispositioning rules adjuster 460 can adjust the minimum allowed delay for the IC chip, which is associated with a slowest allowable IC chip Fmax value, in order to ensure that systems which incorporate the IC chips have an Fmax that is no slower than the slowest allowable system Fmax value 411.

Optionally, the processor(s) can further comprise an IC chip yield loss calculator 470. This IC chip yield loss calculator 470 can determine (e.g., can be adapted to determine, can be configured to determine, can be programmed to determine, etc.) whether use of the IC chip dispositioning rule, as adjusted by the IC chip dispositioning rules adjuster 460, will result in an anticipated IC chip yield loss above a threshold IC chip yield loss value 415. This threshold IC chip yield loss value 415 can be predetermined based on a cost-benefit analysis associated with the manufacturing contract (e.g., by considering the costs associated with manufacturing the IC chips, the anticipated profits, etc.). If the anticipated IC chip yield loss is not above the threshold, then the adjusted IC chip dispositioning rule can be applied following subsequent manufacture of IC chips. However, if the use of the IC chip dispositioning rule, as adjusted, will result in an anticipated yield loss above the threshold, the business plan can be re-evaluated and any number of alternative process steps could be performed. For example, the contract could be cancelled, contract renegotiations could be entered into with the customer to cover the additional costs associated with yield loss, manufacturing process specifications could be adjusted in attempt to better meet the target system performance value, etc.

As discussed in detail above, the correlation determined by the correlator 450 and used by the dispositioning rules adjuster 460 to adjust the IC chip dispositioning rule 414 is established based on empirical data and, particularly, established based on both IC chip performance measurements 412 and system performance measurements 413. However, it should be understood that with the advancement of simulation software, performance at both the IC chip-level and system-level can be simulated during IC chip and system design (e.g., by a design tool 440) in order to establish the IC chip dispositioning rule in the first place. That is, optionally, as the IC chip and system, which will incorporate the IC chip, are being designed, the design tool 440 can establish (i.e., can be adapted to establish, can be configured to establish, can be programmed to establish, etc.) an IC chip process window suitable for achieving a target system process window can be determined. Then, the initial IC chip dispositioning rule 414 and, particularly, the screening value to be applied during post-manufacture (i.e., wafer-level or module-level) IC chip dispositioning can be established by the design tool 440 by running performance path test timing based on this IC chip process window. For example, as performance path test timing runs are being performed, the IC chip Fmax (slow) value (e.g., $3.0\sigma$ Fmax (slow)) can be defined based on the system process window and, particularly, the system Fmax (slow) value.

It should be understood that the computer system embodiments described above could be implemented, in whole or in part, in a computer hardware environment (e.g., a computer system) such as that described in detail below and depicted in FIG. 5. Alternatively, the computer system embodiments could be implemented on any other computerized device having the required data storage and processing capability to perform the described curve fitting and curve remapping processes (e.g., a laptop computer, tablet computer, handheld device, smart phone, etc.).

Also disclosed herein are embodiments of a computer program product. This computer program product can comprise a computer-readable storage medium, which stores a computer-readable program code. The computer-readable program code can comprise instructions that, when executed by a computer, perform the above-described method for optimizing system yield based on the results of post-manufacture integrated circuit (IC) chip performance path testing. More particularly, as will be appreciated by one skilled in the art, aspects of disclosed embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed embodiments may take the form of a computer program product embodied in one or more computer-readable medium(s) having computer-readable program code embodied thereon.

Any combination of one or more computer-readable medium(s) may be utilized. The computer-readable medium may be a non-transitory computer-readable storage medium or computer-readable signal medium. A computer-readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device. A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer programs products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
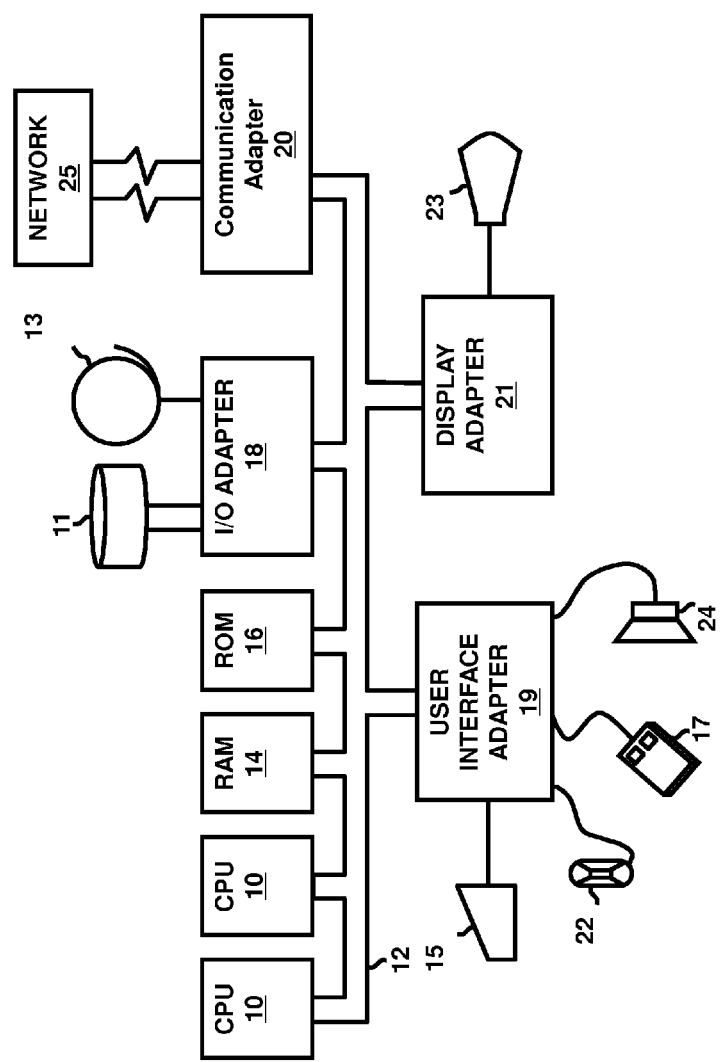
FIG. 5 is a schematic diagram illustrating a representative hardware environment for practicing disclosed embodiments.

A representative hardware environment for practicing the method, system and computer program product embodiments, as described in detail above, is depicted in FIG. 5. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the disclosed embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to disclosed embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a method, system and computer program for optimizing system yield based on the results of post-manufacture integrated circuit (IC) chip performance path testing. In these the embodiments, a correlation can be made between IC chip performance measurements, which were acquired from IC chips specifically during post-manufacture (i.e., wafer-level or module-level) performance path testing, and system performance measurements, which were acquired from systems incorporating IC chips previously subjected to performance path testing. Based on this correlation and a target system performance value, a post-manufacture (i.e., wafer-level or module-level) IC chip dispositioning rule can be adjusted in order to optimize system yield (i.e., to ensure that subsequently manufactured systems which incorporate the IC chip meet the target system performance value). Optionally, simulation of such processing can be performed during design of the IC chip for incorporation into the system in order establish the initial IC chip dispositioning rule in the first place.

What is claimed is:

1. A method for optimizing system yield, said method comprising:
  accessing, by a computer from memory, the following:
    a target system performance value;
    integrated circuit chip performance measurements acquired during performance path testing of a group of integrated circuit chips; and
    system performance measurements acquired during performance testing of a group of systems, each system in said group of systems incorporating at least one of said integrated circuit chips from said group of integrated circuit chips;
  determining, by said computer, a correlation between said integrated circuit chip performance measurements and said system performance measurements; and
  adjusting, by said computer and based on said correlation and said target system performance value, an integrated circuit chip dispositioning rule, said integrated circuit chip dispositioning rule defining an integrated circuit chip performance measurement required for passing said performance path testing and, as adjusted, being applied to subsequently manufactured integrated circuit chips.

2. The method of claim 1, each system performance measurement of each system comprising any of:
  maximum operating frequency of said system;
  maximum operating frequency of a portion of said system, said portion incorporating said at least one of said integrated circuit chips.

3. The method of claim 1, each integrated circuit chip performance measurement comprising maximum operating frequency of an integrated circuit chip.

4. The method of claim 1, said performance path testing comprising testing of a set of sensitizable data paths under specified tests conditions, said set of sensitizable data paths being selected based on results of a timing run performed during integrated circuit chip design using statistical modeling and based on a specified integrated circuit chip process window.

5. The method of claim 1, said performance path testing comprising module-level performance path testing.

6. The method of claim 1, said performance path testing comprising wafer-level performance path testing.

7. The method of claim 1, further comprising, determining, by said computer, whether use of said integrated circuit chip dispositioning rule, as adjusted, will result in an anticipated yield loss above a threshold yield loss value.

8. The method of claim 1, further comprising, during integrated circuit chip design,
  determining, by said computer, an integrated circuit chip process window suitable for achieving a target system process window; and
  establishing, by said computer, said integrated circuit chip dispositioning rule by running performance path test timing based on said integrated circuit chip process window.

9. A system for optimizing system yield, said system comprising:
  a memory storing the following:
    a target system performance value;
    integrated circuit chip performance measurements acquired during performance path testing of a group of integrated circuit chips; and
    system performance measurements acquired during performance testing of a group of systems, each system in said group of systems incorporating at least one of said integrated circuit chips from said group of integrated circuit chips;
  at least one processor in communication with said memory, said at least one processor comprising:
    a correlator determining a correlation between said integrated circuit chip performance measurements and said system performance measurements; and
    a dispositioning rule adjuster adjusting, based on said correlation and said target system performance value, an integrated circuit chip dispositioning rule, said integrated circuit chip dispositioning rule defining an integrated circuit chip performance measurement required for passing said performance path testing and, as adjusted, being applied to subsequently manufactured integrated circuit chips.

10. The system of claim 9, each system performance measurement of each system comprising any of:
  maximum operating frequency of said system;
  maximum operating frequency of a portion of said system, said portion incorporating said at least one of said integrated circuit chips.

11. The system of claim 9, each integrated circuit chip performance measurement comprising maximum operating frequency of an integrated circuit chip.

12. The system of claim 9 said performance path testing comprising testing of a set of sensitizable data paths under specified tests conditions, said set of sensitizable data paths being selected based on results of a timing run performed during integrated circuit chip design using statistical modeling and based on a specified integrated circuit chip process window.

13. The system of claim 9, said performance path testing comprising module-level performance path testing.

14. The system of claim 9, said performance path testing comprising wafer-level performance path testing.

15. The system of claim 9, said at least one processor further comprising a yield loss calculator, said yield lost calculator determining whether use of said integrated circuit chip dispositioning rule, as adjusted, will result in an anticipated yield loss above a threshold yield loss value.

16. The system of claim 9, said at least one processor further comprising a design tool determining an integrated circuit chip process window suitable for achieving a target system process window, said design tool further establishing said integrated circuit chip dispositioning rule by running performance path test timing based on said integrated circuit chip process window.

17. A computer program product comprising a computer-readable storage device storing computer-readable program code, said computer-readable program code comprising instructions that, when executed by a computer, perform a method for optimizing system yield, said method comprising:

accessing the following from memory:

a target system performance value;

integrated circuit chip performance measurements acquired during performance path testing of a group of integrated circuit chips; and system performance measurements acquired during performance testing of a group of systems, each system in said group of systems incorporating at least one of said integrated circuit chips from said group of integrated circuit chips;

determining a correlation between said integrated circuit chip performance measurements and said system performance measurements; and adjusting, based on said correlation and said target system performance value, an integrated circuit chip dispositioning rule, said integrated circuit chip dispositioning rule defining an integrated circuit chip performance measurement required for passing said performance path testing and, as adjusted, being applied to subsequently manufactured integrated circuit chips.

18. The computer program product of claim 17, each system performance measurement of each system comprising any of:

maximum operating frequency of said system;

maximum operating frequency of a portion of said system, said portion incorporating said at least one of said integrated circuit chips.

19. The computer program product of claim 17, each integrated circuit chip performance measurement comprising maximum operating frequency of an integrated circuit chip.

20. The computer program product of claim 17, said performance path testing comprising any one of module-level performance path testing and wafer-level performance path testing.

* * * * *